(12) United States Patent
Beausoleil et al.

(10) Patent No.: US 6,618,698 B1
(45) Date of Patent: Sep. 9, 2003

(54) CLUSTERED PROCESSORS IN AN EMULATION ENGINE

(75) Inventors: William F. Beausoleil, Hopewell Junction, NY (US); Tak-kwong Ng, Hyde Park, NY (US); Helmut Roth, Hopewell Junction, NY (US); Peter Tannenbaum, Red Hook, NY (US); N. James Tomassetti, Kingston, NY (US)

(73) Assignee: Quickturn Design Systems, Inc., San Jose, CA (US)

( * ) Notice: Subject to any disclaimer, the term of this patent is extended or adjusted under 35 U.S.C. 154(b) by 0 days.

(21) Appl. No.: 09/373,125

(22) Filed: Aug. 12, 1999

(51) Int. Cl.[7] .............................................. G06F 9/455
(52) U.S. Cl. ............................ 703/23; 703/20; 703/25; 712/11; 712/20; 712/23
(58) Field of Search ............................ 703/23, 20, 25; 712/20, 23, 11

(56) References Cited

U.S. PATENT DOCUMENTS

| | | | |
|---|---|---|---|
| 3,775,598 A | 11/1973 | Chao et al. ................. | 235/153 |
| 4,306,286 A | 12/1981 | Cocke et al. ............... | 364/200 |
| 4,594,677 A | 6/1986 | Barlow ....................... | 364/578 |
| 4,656,580 A | 4/1987 | Hitchcock, Sr. et al. .... | 364/200 |
| 4,744,084 A | 5/1988 | Beck et al. .................. | 371/23 |
| 4,754,398 A * | 6/1988 | Pribnow ..................... | 709/226 |
| 4,769,817 A | 9/1988 | Krohn et al. ................ | 371/23 |
| 4,775,950 A | 10/1988 | Terada et al. ............... | 364/578 |
| 4,782,440 A | 11/1988 | Nomizu et al. ............. | 364/200 |
| 4,819,150 A | 4/1989 | Jennings et al. ........... | 364/200 |
| 4,862,347 A | 8/1989 | Rudy ......................... | 364/200 |
| 4,914,612 A | 4/1990 | Beece et al. ................ | 364/578 |
| 4,918,594 A | 4/1990 | Onizuka ..................... | 364/200 |
| 5,132,971 A * | 7/1992 | Oguma et al. ............... | 714/28 |
| 5,146,460 A | 9/1992 | Ackerman et al. ........... | 371/23 |
| 5,179,672 A | 1/1993 | Genduso et al. ............ | 395/375 |
| 5,210,700 A | 5/1993 | Tom ............................ | 364/489 |
| 5,263,149 A | 11/1993 | Winlow ...................... | 395/500 |
| 5,299,313 A | 3/1994 | Petersen et al. ............ | 395/200 |
| 5,313,618 A * | 5/1994 | Pawloski ..................... | 703/28 |
| 5,327,361 A | 7/1994 | Long et al. .................. | 364/57 |
| 5,329,470 A | 7/1994 | Sample et al. .............. | 364/578 |
| 5,339,262 A | 8/1994 | Rostoker et al. ............ | 364/578 |
| 5,375,074 A | 12/1994 | Greenberg et al. .......... | 364/578 |
| 5,410,300 A | 4/1995 | Gould et al. ........... | 340/825.79 |
| 5,425,036 A | 6/1995 | Liu et al. ...................... | 371/23 |
| 5,442,772 A | 8/1995 | Childs et al. ............... | 395/500 |
| 5,448,496 A | 9/1995 | Butts et al. ................. | 364/489 |
| 5,452,231 A | 9/1995 | Butts et al. ................. | 364/489 |
| 5,452,239 A | 9/1995 | Dai et al. .................... | 364/578 |

(List continued on next page.)

OTHER PUBLICATIONS

Encyclopedia of Computer Science, A. Ralston, p. 1248, ISBN 0–88405–321–0, 1975.*

Microsoft Press Computer Dictionary, p. 447, ISBN 1–57231–446–X, 1997.*

Computer Systems Architecture, J. Baer, ISBN 0–914894–15–3, Computer Science Press, 1980.*

Collins, L., "Way Ahead of the Pack," *Electronics Times*, Jan. 30, 1997, pp. 16–17.

Primary Examiner—Kevin J. Teska
Assistant Examiner—Fred Ferris
(74) Attorney, Agent, or Firm—Orrick, Herrington & Sutcliffe LLP

(57) ABSTRACT

Clusters of processors are interconnected as an emulation engine such that processors share input and data stacks, and the setup and storing of results are done in parallel, but the output of one evaluation unit is connected to the input of the next evaluation unit. A set of 'cascade' connections provides access to the intermediate values. By tapping intermediate values from one processor, and feeding them to the next, a significant emulation speedup is achieved.

13 Claims, 5 Drawing Sheets

U.S. PATENT DOCUMENTS

| | | | |
|---|---|---|---|
| 5,475,624 A | 12/1995 | West | 364/578 |
| 5,477,475 A | 12/1995 | Sample et al. | 364/578 |
| 5,490,266 A | 2/1996 | Sturges | 395/500 |
| 5,537,341 A | 7/1996 | Rose et al. | 364/579 |
| 5,548,785 A | 8/1996 | Fogg, Jr. et al. | 395/841 |
| 5,551,013 A * | 8/1996 | Beausoleil et al. | 703/23 |
| 5,566,097 A | 10/1996 | Myers et al. | 364/578 |
| 5,581,562 A | 12/1996 | Lin et al. | 371/22.1 |
| 5,583,450 A | 12/1996 | Trimberger et al. | 326/41 |
| 5,590,345 A * | 12/1996 | Barker et al. | 712/11 |
| 5,590,372 A | 12/1996 | Dieffenderfer et al. | 395/823 |
| 5,596,742 A | 1/1997 | Agarwal et al. | 395/500 |
| 5,600,263 A | 2/1997 | Trimberger et al. | 326/39 |
| 5,602,754 A | 2/1997 | Beatty et al. | 364/489 |
| 5,612,891 A | 3/1997 | Butts et al. | 364/489 |
| 5,615,127 A | 3/1997 | Beatty et al. | 364/489 |
| 5,629,637 A | 5/1997 | Trimberger et al. | 326/93 |
| 5,629,858 A | 5/1997 | Kundu et al. | 364/488 |
| 5,634,003 A | 5/1997 | Saitoh et al. | 395/200.1 |
| 5,644,515 A | 7/1997 | Sample et al. | 364/578 |
| 5,646,545 A | 7/1997 | Trimberger et al. | 326/38 |
| 5,696,987 A | 12/1997 | DeLisle et al. | 395/800 |
| 5,699,283 A | 12/1997 | Okazaki et al. | 364/578 |
| 5,701,441 A | 12/1997 | Trimberger | 395/500 |
| 5,715,172 A | 2/1998 | Tzeng | 364/490 |
| 5,715,433 A | 2/1998 | Raghavan et al. | 395/500 |
| 5,721,695 A | 2/1998 | McMinn et al. | 364/578 |
| 5,721,953 A | 2/1998 | Fogg, Jr. et al. | 395/841 |
| 5,727,217 A * | 3/1998 | Young | 703/24 |
| 5,734,581 A | 3/1998 | Butts et al. | 364/489 |
| 5,734,869 A | 3/1998 | Chen | 395/500 |
| 5,737,578 A | 4/1998 | Hennenhoefer et al. | 395/500 |
| 5,742,180 A | 4/1998 | DeHon et al. | 326/40 |
| 5,754,871 A * | 5/1998 | Wilkinson et al. | 712/20 |
| 5,761,483 A | 6/1998 | Trimberger | 395/500 |
| 5,761,484 A | 6/1998 | Agarwal et al. | 395/500 |
| 5,784,313 A | 7/1998 | Trimberger et al. | 365/182 |
| 5,790,479 A | 8/1998 | Conn | 368/118 |
| 5,796,623 A | 8/1998 | Butts et al. | 364/489 |
| 5,798,645 A | 8/1998 | Zeiner et al. | 364/578 |
| 5,801,955 A | 9/1998 | Burgun et al. | 364/489 |
| 5,802,348 A | 9/1998 | Stewart et al. | 395/500 |
| 5,812,414 A | 9/1998 | Butts et al. | 364/489 |
| 5,815,687 A | 9/1998 | Masleid et al. | 395/500 |
| 5,819,065 A | 10/1998 | Chilton et al. | 395/500 |
| 5,822,564 A | 10/1998 | Chilton et al. | 395/500 |
| 5,822,570 A | 10/1998 | Lacey | 395/500 |
| 5,825,662 A | 10/1998 | Trimberger | 364/491 |
| 5,842,031 A * | 11/1998 | Barker et al. | 712/23 |
| 5,966,528 A * | 10/1999 | Wilkinson et al. | 712/222 |
| 6,035,117 A * | 3/2000 | Beausoleil et al. | 703/25 |
| 6,051,030 A * | 4/2000 | Beausoleil et al. | 703/20 |
| 6,075,937 A * | 6/2000 | Scalzi et al. | 703/23 |
| 6,370,585 B1 * | 4/2002 | Hagersten et al. | 709/213 |

* cited by examiner

CLUSTERED PROCESSORS IN AN EMULATION ENGINE

FIELD OF THE INVENTION

This invention relates to processor-based emulation engines.

TRADEMARKS

IBM is a registered trademark of International Business Machines Corporation, Armonk, N.Y.

BACKGROUND

Hardware emulators are programmable devices used in the verification of logic designs. A common method of logic design verification is to use processors to emulate the design. These processor-based emulators sequentially evaluate combinatorial logic levels, starting at the inputs and proceeding to the outputs. Each pass through the entire set of logic levels is called a Target Cycle; the evaluation of each individual logic level is called an Emulation Step.

Speed is a major selling factor in the emulator market, and is a well known problem. The purpose of this invention is to significantly improve our emulator's speed.

Our invention is an improvement over that disclosed in U.S. Pat. No. 5,551,013, "Multiprocessor for Hardware Emulation," issued to Beausoleil, et al., where a software-driven multiprocessor emulation system with a plurality of emulation processors connected in parallel in a module has one or more modules of processors to make up an emulation system. Our current processor-based emulator consists of a large number of interconnected processors, each with an individual control store, as described in detail in the U.S. Pat. No. 5,551,013. It would be desirable to improve the speed of this emulator.

While not suitable for our purposes, but for completeness, we note that FPGA-based emulation systems exist that achieve high speeds for small models. However, FPGA-based emulators are inherently I/O bound, and therefore perform poorly with large models. In general, the problem of high-speed emulation of large models had not been solved.

SUMMARY OF THE INVENTION

We have increased the processor-based emulation speed by increasing the amount of work done during each emulation step. In the original emulator, an emulation step consisted of a setup phase, an evaluation phase, and a storage phase. With this invention, clusters of processors are interconnected such that the evaluation phases can be cascaded. All processors in a cluster perform the setup in parallel. This setup includes routing of the data through multiple evaluation units for the evaluation phase. (For most efficient operation, the input stack and data stack of each processor must be stored in shared memory within each cluster.) Then, all processors perform the storage phase, again in parallel. The net result is multiple cascaded evaluations performed in a single emulation step. A key feature of the invention is that every processor in a cluster can access the input and data stacks of every other processor in the cluster.

DETAILED DESCRIPTION OF THE INVENTION

Figure 1:
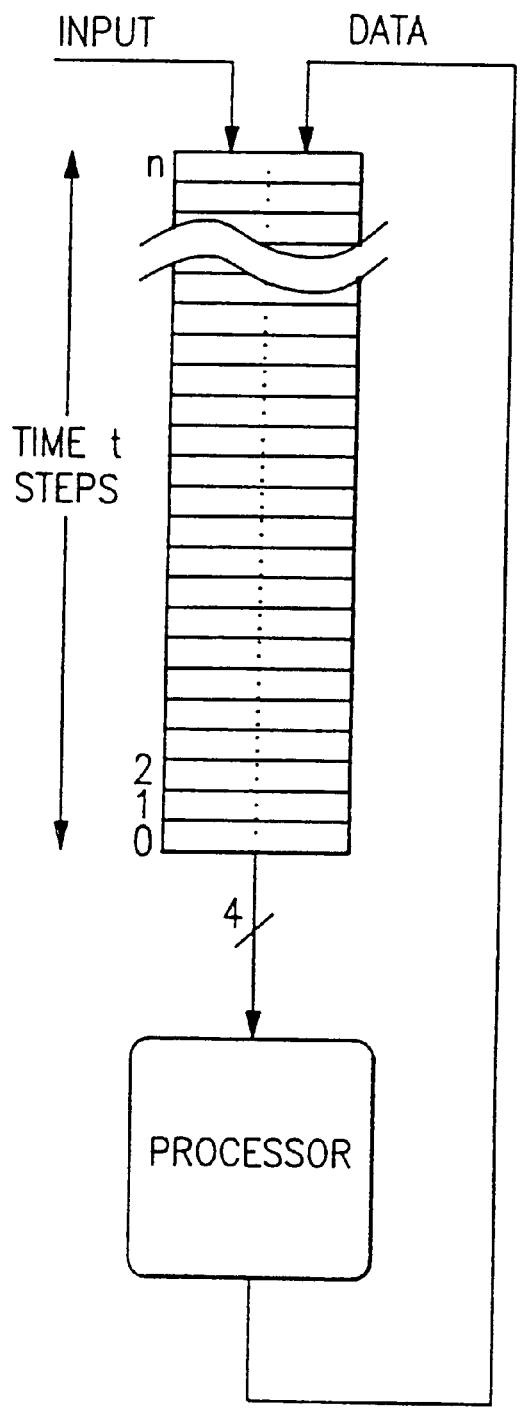
FIG. 1 illustrates how a processor reads a logic function and associated operands from the input and data store, performs the operation, and writes the results, all in a single step.

Before turning to the detailed description of our invention, we would note that one method of speedup is to evaluate independent logic paths in parallel. A parallel system may consist of hierarchically arranged processors: multiprocessor modules on multi-module boards, in a multi-board system. Synchronization is achieved by delaying the start of the next target cycle until the completion of all paths. This means that the effective emulation speed is determined by the time required to evaluate the longest path (called the critical path).

For evaluation of independent logic paths in parallel, we can describe our improvement over that disclosed in U.S. Pat. No. 5,551,013, "Multiprocessor for Hardware Emulation," issued to Beausoleil, et al. (fully incorporated herein by this reference) where a software-driven multiprocessor emulation system with a plurality of emulation processors connected in parallel in a module has one or more modules of processors to make up an emulation system. To illustrate, refer to FIG. 1 of U.S. Pat. No. 5,551,013, which shows an emulation chip, called a module here, having multiple (e.g. 64) processors. All processors within the module are identical and have the internal structure shown in FIG. 1. The sequencer and the interconnection network occurs only once in a module. The control stores hold a program created by an emulation compiler for a specified processor. The stacks hold data and inputs previously generated and are addressed by fields in a corresponding control word to locate the bits for input to the logic element. During each step of the sequencer an emulation processor emulates a logic function according to the emulation program. The data flow control interprets the current control word to route and latch data within the processor. The node-bit-out signal from a specified processor is presented to the interconnection network where it is distributed to each of the multiplexors (one for each processor) of the module. The node address field in the control word allows a specified processor to select for its node-bit-in signal the node-bit-out signal from any of the processors within its module. The node bit is stored in the input stack on every step. During any operation the node-bit-out signal of a specified processor may be accessed by none, one, or all of the processors within the module.

Data routing within each processor's data flow and through the interconnection network occurs independently of and overlaps the execution of the logic emulation function in each processor. Each control store stores control words executed sequentially under control of the sequencer and program steps in the associated module. Each revolution of the sequencer causes the step value to advance from zero to a predetermined maximum value and corresponds to one target clock cycle for the emulated design. A control word in the control store is simultaneously selected during each step of the sequencer. A logic function operation is defined by each control word. Thus, we have provided in FIG. 1 a software-driven multiprocessor emulation system which uses in a module a plurality of emulation processors. Each of these emulation processors has an execution unit for processing multiple types of logic gate functions. Each emulation processor switches from a specified one logic gate function to a next logic gate function in a switched-emulation sequence of different gate functions. The switched-emulation sequence of each of the processors thus can emulate a subset of gates in a hardware arrangement in which logic gates are of any type that the emulation processors functionally represent for a sequence of clock cycles. The processors are coupled by a like number of multiplexors having outputs respectively connected to the emulation processors of a module and having inputs respectively connected to each of the other emulation processors. The bus connected to the multiplexors enables an output from any emulation processor to be transferred to an input of any other of the emulation processors. In accordance with our improvement, it will be understood that we have provided clusters of processors which are interconnected as an emulation engine such that the setup and storing of results is done in parallel, but the output of one evaluation unit is made available as the input of the next evaluation unit. For this purpose we enabled processors to share input and data stacks, and have provided a set of 'cascade' connections which provides access to the intermediate values as we will describe. By tapping 'intermediate' values from one processor, and feeding them to the next, significant emulation speedup is achieved.

The embedded control store in each of the emulation processors stores logic-representing signals for controlling operations of the emulation processor. The emulation engine's processor evaluation unit illustrated by FIG. 1 is provided with an embedded data store for each of the emulation processors which receives data generated by the very same emulation processor under control of software signals stored in the embedded control store in the same emulation processor. It is the controls that are used to transmit data from any emulation processor through a connected multiplexor under control of software signals stored in the embedded control store to control computational emulation of the hardware arrangement by operation of the plurality of processors which form evaluation units of the emulation engine under software control in accordance with the following description of FIGS. 2, 3, 4, and 5.

An execution unit in each processor's emulation unit includes a table-lookup unit for emulating any type of logic gate function and a connection from the output of each processor to a multiplexor input with every other processor in a module. Each processor embeds a control store to store software logic-representing signals for controlling operations of each processor. Also in the prior system a data store is embedded in each processor to receive data generated under control of the software signals in the control store. The parallel processors on each module have a module input and a module output from each processor. The plurality of modules have their module outputs interconnected to module inputs of all other modules. A sequencer synchronously cycles the processors through mini-cycles on all modules. Logic software drives all of the processors in the emulation system to emulate a complex array of Boolean logic, which may represent all of the logic gates in a complex logic semiconductor chip or system. Each cycle of processing may control the emulation of a level of logic being verified by the single emulation processor illustrated in FIG. 1, having our 'cascade' connection control facility improvement.

Figure 2:
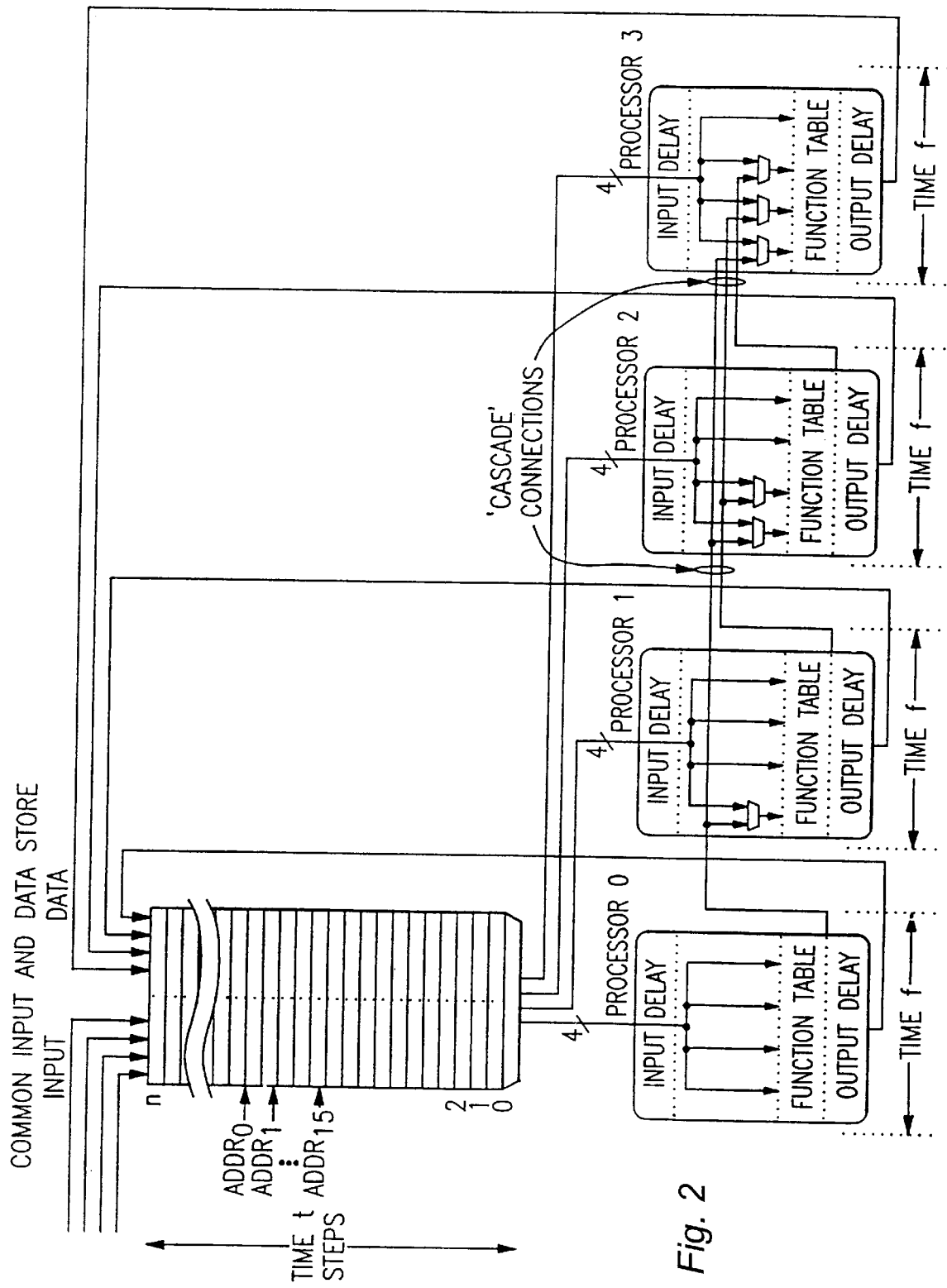
FIG. 2 illustrates how, in accordance with the invention, clusters of processors share input and data stacks and are interconnected such that the setup and storing of results is done in parallel, and an option is available to route the output of one evaluation unit, via 'cascade' connections, to the input of the next evaluation unit.

For a more detailed understanding of our invention, it should be understood that at each emulation step, a processor reads a logic function and associated operands from the data store, performs the operation, and writes the results as illustrated by FIG. 2 (consider the first stage as illustrative here). The internal clock frequency of the emulator is given as $(1/t)$, where t is the time taken for a single step. In general, if a processor is designated to evaluate the critical path with n logic levels, then the time taken will be $(n*t)$. (This assumes that the evaluation of the logic levels is not delayed by the availability of the input signals. Sharing input and data stacks within the clusters greatly enhances the probability that signals are available when needed.) The effective speed of the emulator, measured in cycles per unit time, is given as $1/(n*t)$. As our goal is to make the emulator run as fast as possible, we have developed the system as illustrated, where when, as stated above, t represents the time taken for a single emulation step, our invention enables, with the ability to evaluate four logic functions in the same time t, a 400% speedup by enabling each processor to evaluate effectively in parallel four (four stages are shown in FIG. 2) logic functions in this same time t.

Before we developed our current emulator, the clock granularity was the time for one processor to evaluate one logic function. We have found that signal propagation times and power consumption considerations determine the step time t. This time t is greater-than or equal-to $D1+D2+D3+D4$.

This sum, $D1+D2+D3+D4$, includes reading from the data store, setting up the operation, performing the evaluation, and storing the results. Note that setup can include gathering data from other processors on the same module or on other modules. We determined that for our planned interconnection networks, the setup times dominate the sum; there is a large differential between the amount of time spent during setup versus the amount of time spent during the logic evaluation.

We have provided, in accordance with our invention, the ability to exploit this time differential by tapping the results from one processor and feeding them to the next, within the step time t. Thus, when clusters of processors are interconnected such that the setup and storing of results is done in parallel, as illustrated by FIG. 2, the output of one evaluation unit has the option of being connected to the input of the next evaluation units. We have, in accordance with our invention, a set of 'cascade' connections which provides access to these intermediate values.

Figure 3:
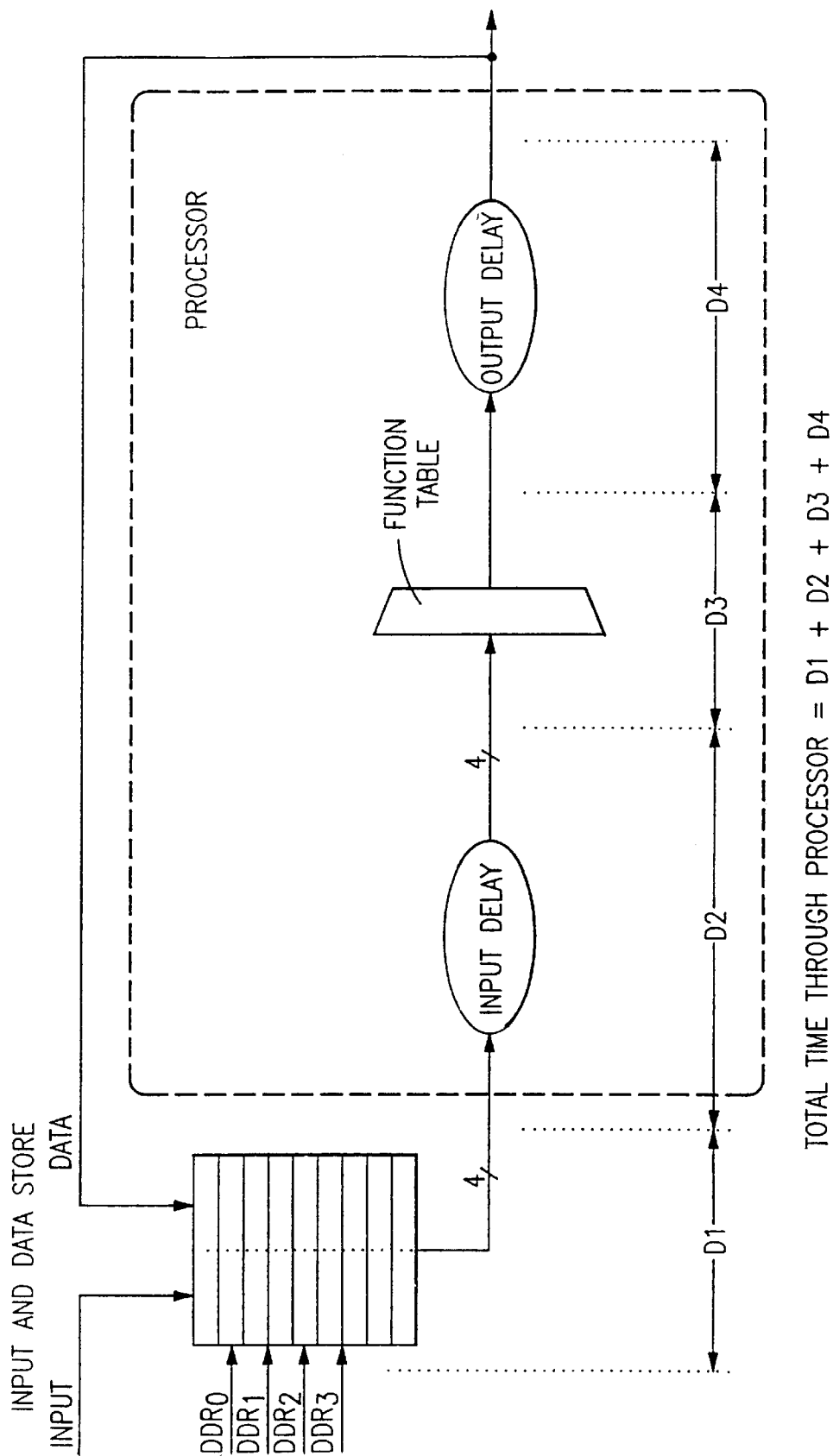
FIG. 3 illustrates a single processor, with times listed as D1 through D4, showing how the total step time is equal to the sum D1+D2+D3+D4.
Figure 4:
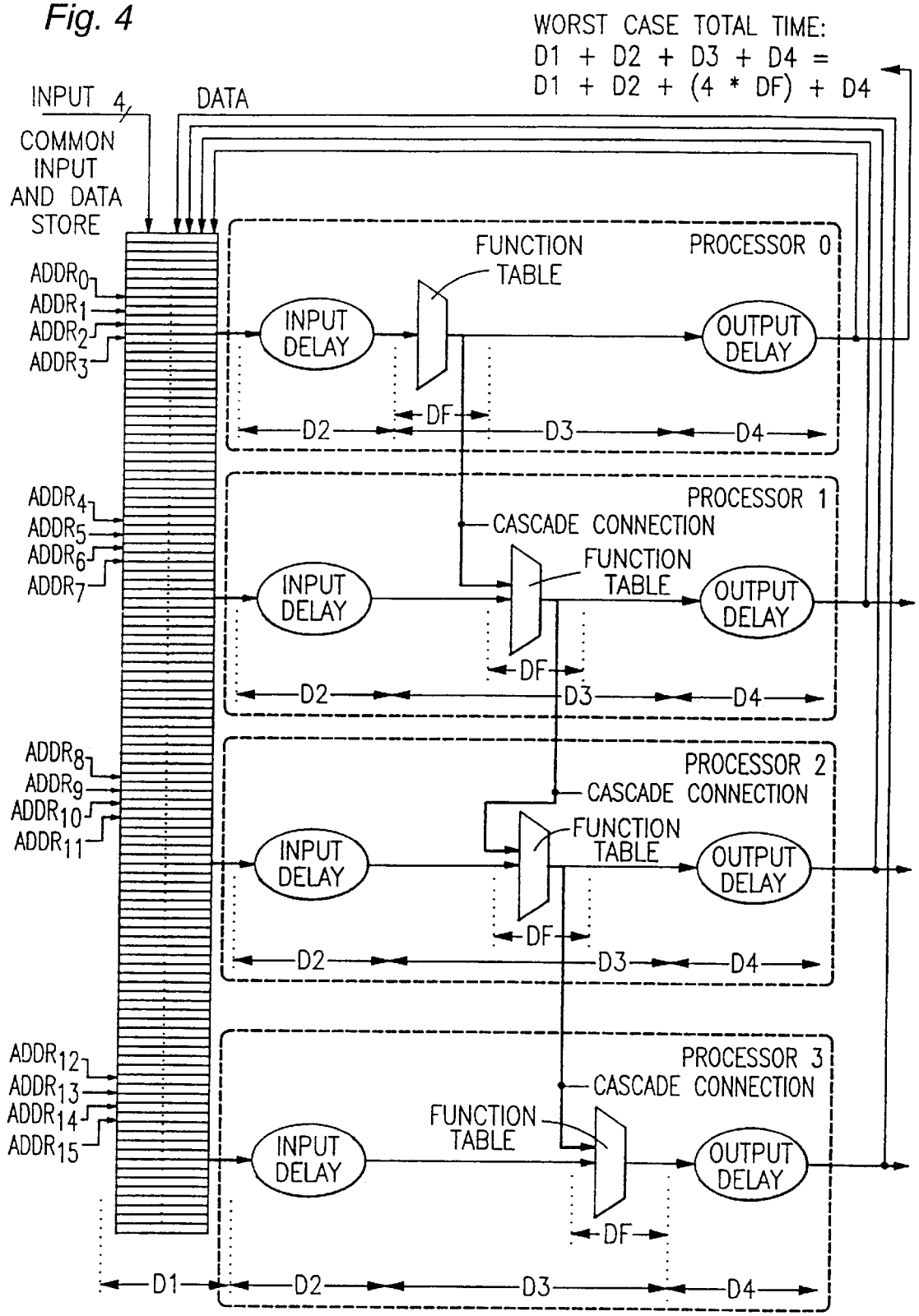
FIG. 4 shows four clustered processors and their shared input and data stacks, with the signal 'cascading' through the four function evaluation units, and with the total step time equal to the same sum D1+D2+D3+D4.

FIG. 3 shows a single processor, with the times listed as D1 through D4; the relative times are not drawn to scale. The total step time t is equal to the sum $D1+D2+D3+D4$. Now when we illustrate our invention in accordance with FIG. 4 with four clustered processors arranged with the signal flowing through all four function evaluation units, here again, the total step time is $D1+D2+D3+D4$. Note that the number of evaluations that can be performed within a step is limited by the relative times of DF and D3. The connections between the processors in FIG. 4 are through the cascade connections shown in FIG. 2. To visualize the speedup achieved through this invention, consider a logic path with 18 levels, A through R. In our current emulator, each evaluation would take a single step, for a total time of 18 steps. With this invention, levels A through D would be distributed among the four processors in a cluster for evaluation in the first step. E through H would be distributed to the same four processors for evaluation in the second step. I through L would be evaluated in the third step, M through P in the fourth step, and Q and R in the fifth step. The evaluation of the entire path would be reduced from 18 to 5 steps.

Figure 5:
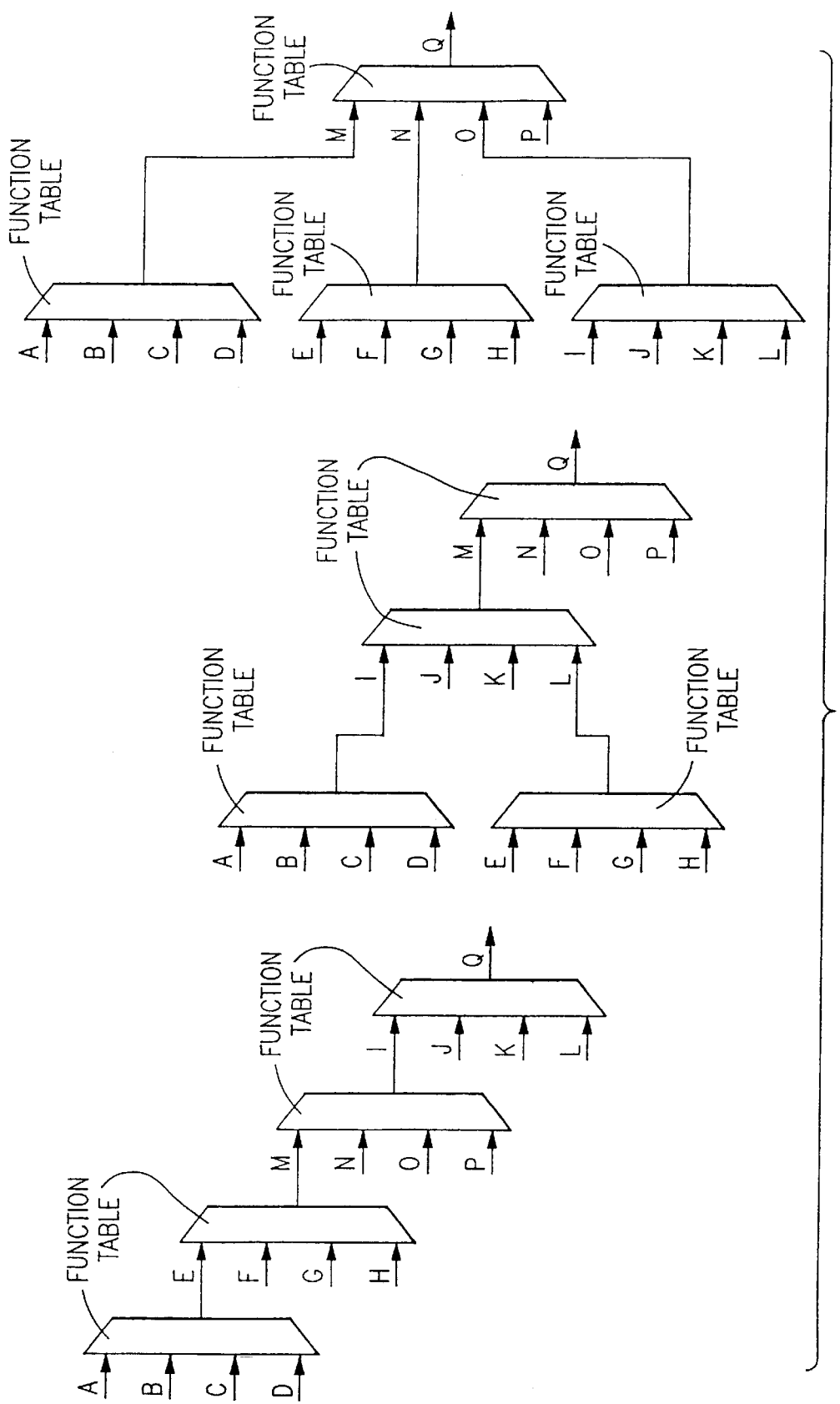
FIG. 5 illustrates three methods of routing thirteen signals through four function evaluation units, with the total step time in each case equal to the same sum D1+D2+D3+D4.

Illustrating how different connections can be made for differing numbers of processors, FIG. 5 illustrates three methods of routing thirteen signals through four function evaluation units, with the total step time in each case equal to the same sum D1+D2+D3+D4.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for use in a software-driven multiprocessor emulation system, wherein there are a plurality of emulation processors, each emulation processor containing an execution unit for processing multiple types of logic gate functions, with means provided for each emulation processor to switch from one logic gate function to a next logic gate function in a switched-emulation sequence of different gate functions, and wherein the switched-emulation sequence of each of the plurality of processors enables emulating a subset of gates in a hardware arrangement in which logic gates are of any type that the emulation processors functionally represent for a sequence of clock cycles, and wherein a plurality of multiplexors having outputs respectively connected to the emulation processors and having inputs respectively connected to each of the other emulation processors, and bus means connected to the multiplexors to enable an output from any emulation processor to be transferred to an input of any other of the emulation processors, an embedded control store in each of the emulation processors to store software logic-representing signals for controlling operations of the emulation processor, an embedded data store in each of the emulation processors to receive input for, and data generated by the same emulation processor under control of software signals stored in the embedded control store in the same emulation processor, and bus controls to transmit data on the bus from any emulation processor through a connected multiplexor under control of software signals stored in the embedded control store to control computational emulation of the hardware arrangement by operation of the plurality of emulation processors under software control, comprising the steps of:

on an integrated circuit, arranging said plurality of emulation processors to form a plurality of clusters of processors such that the setup and storing of results calculated by each of said plurality of emulation processors within each of said plurality of clusters is done in parallel, but the output of one of said emulation processors within each of said plurality of clusters is made available as the input of said emulation processors within each of said plurality of clusters via a set of 'cascade' connections to intermediate values used in the emulation engine by tapping said intermediate values from one emulation processor within one of said plurality of clusters, and feeding said intermediate values to the next emulation processor within said one of said plurality of clusters via said cascade connections to exploit a time differential between data flow where time is measured as the time taken to perform a single emulation step.

2. The method according to claim 1, wherein for each emulation step, an emulation processor reads a logic function and associated operands from the data store, performs the operation, and writes the results with an effective speed of the emulation; measured in cycles per unit time, given as $1/(n*t)$, where n is the number of logic levels emulated and t is the time measured as the time taken to perform a single emulation step, and multiple logic functions are evaluated effectively in parallel at the same time t.

3. The method according to claim 2, wherein for each cluster, a single emulation step includes reading from the data store (which contains both input data and generated data), setting up the operation, performing the evaluation, and storing the results as an intermediate value, and feeding said intermediate value from one processor to the next processor of a cluster, such that the setup and storing of results is done in parallel with the output of one emulation processor connected to the input of the next emulation processor with said cascade connection providing access to the intermediate values.

4. The method according to claim 3, wherein signals flow through all emulation processors within a cluster, and wherein multiple logic levels are distributed among said emulation processors within a cluster for evaluation as a single step, with the same emulation processors within a cluster being employed for evaluation of additional logic levels in additional steps employed for other logic levels with n evaluation steps, where n is the number of logic levels evaluated.

5. A method for use in a software-driven multiprocessor emulation system, wherein there are a plurality of emulation processors, each emulation processor containing an execution unit for processing multiple types of logic gate functions, with means provided for each emulation processor to switch from one logic gate function to a next logic gate function in a switched-emulation sequence of different gate-functions, and wherein the switched-emulation sequence of each of the plurality of processors enables emulating a subset of gates in a hardware arrangement in which logic gates are of any type that the emulation processors functionally represent for a sequence of clock cycles, and wherein a plurality of multiplexors having outputs respectively connected to the emulation processors and having inputs respectively connected to each of the other emulation processors, and bus means connected to the multiplexors to enable an output from any emulation processor to be transferred to an input of any other of the emulation processors, an embedded control store in each of the emulation processors to store software logic-representing signals for controlling operations of the emulation processor, an embedded data store in each of the emulation processors to receive input for, and data generated by the same emulation processor under control of software signals stored in the embedded control store in the same emulation processor, and bus controls to transmit data on the bus from any emulation processor through a connected multiplexor under control of software signals stored in the embedded control store to control computational emulation of the hardware arrangement by operation of the plurality of emulation processors under software control, comprising the steps of:

on an integrated circuit, arranging said plurality of emulation processors to form a plurality of clustered processors, each of said plurality of clustered processors sharing one input and data stacks, said clustered processors providing an emulation engine such that the setup and storing of results is done in parallel, but the output of one of said plurality of emulation processors is made available as the input of a next one of said plurality of emulation processors via a set of 'cascade' connections to intermediate values used in the emulation engine by tapping said intermediate values from one of said emulation processors within one of said clustered processors, and feeding said intermediate values to the next one of said emulation processors within one of said clustered processors via said cascade connections to exploit a time differential between data flow where time is measured as the time taken to perform a single emulation step.

6. The method according to claim 5, wherein for each emulation step, an emulation processor reads a logic function and associated operands from the data store of any emulation processor within the clustered processor, performs the operation, and writes the results with an effective speed of the emulation, measured in cycles per unit time, given as $1/(n*t)$, where n is the number of logic levels emulated and t is the time measured as the time taken to perform a single emulation step, and multiple logic functions are evaluated effectively in parallel at the same time t.

7. The method according to claim 6, wherein for each emulation engine, a single emulation step includes reading from the data store (which contains both input data and generated data) of any emulation processor within the clustered processor, setting up the operation, performing the evaluation, and storing the results as an intermediate value, and feeding the intermediate value from one emulation processor to the next emulation processor of a clustered processor when emulation processors within a clustered processor are interconnected with a cascade connection, such that the setup and storing of results is done in parallel with the output of one emulation processor connected to the input of the next emulation processor with said cascade connection providing access to the intermediate values.

8. The method according to claim 7, wherein with clustered processors share input and data stacks, arranged with the signal flowing through all emulation processors within said clustered processors, and wherein multiple logic levels are distributed among said emulation processors within a clustered processor for evaluation as a single step, with the same clustered processors being employed for evaluation of additional logic levels in additional steps employed for other logic levels with n evaluation steps, where n is the number of logic levels evaluated.

9. An integrated circuit used in a processor-based system for emulating logic designs comprised of combinatorial and sequential logic gates, comprising:
  a plurality of input and data stack structures;
  a plurality of clusters of emulation processors, each of said plurality of clusters of emulation processors comprising a plurality of emulation processors, each of said plurality of emulation processors comprising an execution unit that sequentially evaluates the combinatorial logic functions;
  an interconnection network for interconnecting outputs from each of said plurality of emulation processors to inputs on any other of said plurality of emulation processors; and
  each of said plurality of clusters of emulation processors being associated with a corresponding one of said plurality of input and data stack structures such that outputs from said corresponding one of said plurality of input and data stack structures are provided to each of said plurality of processors within one of said plurality of clusters of emulation processors and outputs from each of said plurality of emulation processors within said one of said plurality of clusters of emulation processors are input to said corresponding one of said plurality of input and data stack structures.

10. The integrated circuit of claim 9 further comprising a plurality of cascade connections, each of said plurality of cascade connections placing a first of said plurality of emulation processors within one of said plurality of clusters of emulation processors in substantially direct electrical communication with all others of said plurality of emulation processors within said one of said plurality of clusters of emulation processors.

11. The integrated circuit of claim 9 wherein one of said plurality of emulation processors within each of said plurality of clusters of emulation processors can have its output directed to either a subsequent one of said plurality of emulation processors within each of said plurality of clusters of emulation processors through a cascade connection or to said corresponding one of said plurality of input and data stack structures.

12. An integrated circuit used in a processor-based system for emulating logic designs comprised of combinatorial and sequential logic, comprising:
  a plurality of emulation processors, each of said plurality of emulation processors comprising an execution unit that sequentially evaluates the combinatorial logic functions, wherein said plurality of emulation processors are arranged as a plurality of clusters of emulation processors;
  an interconnection network for interconnecting outputs from each of said plurality of emulation processors to inputs on any other of said plurality of emulation processors; and
  a plurality of cascade connections, each of said plurality of cascade connections making outputs from said execution unit available to said execution unit within a subsequent one of said plurality of emulation processors within one of said plurality of clusters of emulation processors.

13. The integrated circuit of claim 12 further comprising a plurality of input and data stack structures;
  each of said plurality of clusters of emulation processors sharing a corresponding one of said plurality of input and data stack structures such that outputs from said corresponding one of said plurality of input and data stack structures are provided to each of said plurality of processors within one of said plurality of clusters of emulation processors and outputs from each of said plurality of emulation processors within said one of said plurality of clusters of emulation processors are input to said corresponding one of said plurality of input and data stack structures.

* * * * *